(12) United States Patent
Lin et al.

(10) Patent No.: US 7,118,954 B1
(45) Date of Patent: Oct. 10, 2006

(54) HIGH VOLTAGE METAL-OXIDE-SEMICONDUCTOR TRANSISTOR DEVICES AND METHOD OF MAKING THE SAME

(75) Inventors: Chien-Ming Lin, Hsin-Chu (TW);
Ming-Tsung Tung, Hsin-Chu (TW);
Chin-Hung Liu, Taipei Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/908,784

(22) Filed: May 26, 2005

(51) Int. Cl.
*H01L 21/8238* (2006.01)

(52) U.S. Cl. ......... 438/201; 257/E21.68; 257/E21.438; 257/E21.622; 257/E21.636

(58) Field of Classification Search ............ 438/275, 438/201, 211, 593, 257, FOR. 203; 257/192, 257/E21.68, E21.438, E31.622, E21.636, 257/681
See application file for complete search history.

(56) References Cited

U.S. PATENT DOCUMENTS

| | | | | |
|---|---|---|---|---|
| 4,564,854 A | * | 1/1986 | Ogura | 257/296 |
| 4,804,636 A | * | 2/1989 | Groover et al. | 438/275 |
| 4,890,141 A | * | 12/1989 | Tang et al. | 257/372 |
| 5,091,763 A | * | 2/1992 | Sanchez | 257/344 |
| 5,250,464 A | * | 10/1993 | Wong et al. | 438/467 |
| 5,330,929 A | * | 7/1994 | Pfiester et al. | 438/152 |
| 6,229,212 B1 | * | 5/2001 | Dennison et al. | 257/756 |
| 6,259,131 B1 | * | 7/2001 | Sung et al. | 257/315 |
| 6,306,696 B1 | * | 10/2001 | Dennison et al. | 438/157 |
| 2004/0071030 A1 | * | 4/2004 | Goda et al. | 365/222 |
| 2004/0227185 A1 | * | 11/2004 | Matsumoto et al. | 257/347 |
| 2005/0082582 A1 | * | 4/2005 | Rhodes | 257/291 |
| 2005/0145850 A1 | * | 7/2005 | Dennison et al. | 257/72 |

\* cited by examiner

*Primary Examiner*—Matthew Smith
*Assistant Examiner*—Jarrett Stark
(74) *Attorney, Agent, or Firm*—Winston Hsu (57) ABSTRACT

A method for fabricating metal-oxide-semiconductor devices is provided. The method includes forming a gate dielectric layer on a substrate; depositing a polysilicon layer on the gate dielectric layer; forming a resist mask on the polysilicon layer; etching the polysilicon layer not masked by the resist mask, thereby forming a gate electrode; etching a thickness of the gate dielectric layer not covered by the gate electrode; stripping the resist mask; forming a salicide block resist mask covering the gate electrode and a portions of the remaining gate dielectric layer; etching away the remaining gate dielectric layer not covered by the salicide block resist mask, thereby exposing the substrate and forming a salicide block lug portions on two opposite sides of the gate electrode; and making a metal layer react with the substrate, thereby forming a salicide layer that is kept a distance "d" away from the gate electrode.

6 Claims, 9 Drawing Sheets

HIGH VOLTAGE METAL-OXIDE-SEMICONDUCTOR TRANSISTOR DEVICES AND METHOD OF MAKING THE SAME

BACKGROUND OF INVENTION

1. Field of the Invention

The present invention relates to the fabrication of semiconductor integrated circuits and, more particularly, to an improved process for fabricating high-voltage devices. According to the present invention, the salicide process is integrated with the high-voltage process, thereby reducing the resistance of high-voltage metal-oxide-semiconductor transistor devices.

2. Description of the Prior Art

Integrated circuits (ICs) containing both high-voltage and low-voltage devices such as high/low voltage MOS transistor devices are known in the art. For example, the low-voltage device may be used in the control circuits as the high-voltage device may be used in electrically programmable read only memory (EPROM) or the driving circuits of the liquid crystal display devices.

It is also known that self-aligned silicide (also referred to as "salicide") process is typically utilized to form metal silicide layer such as cobalt silicide or titanium silicide on the gates, source or drain regions in order to reduce sheet resistances. However, the salicide process is merely performed on the low-voltage devices. Considering hot carrier effects, the conventional high-voltage process cannot integrate with the salicide process. As a result, the sheet resistance of the high-voltage devices is high.

In light of the above, there is a need to provide an improved method for reducing the sheet resistance of the high-voltage devices.

SUMMARY OF INVENTION

It is the primary object of the present invention to provide an improved high-voltage process for fabricating high-voltage metal-oxide-semiconductor (MOS) devices, thereby reducing the sheet resistance thereof.

According to the claimed invention, a method for fabricating metal-oxide-semiconductor devices is provided. The method includes the steps of:

(1) providing a semiconductor substrate;
(2) forming a gate dielectric layer having a thickness of ti on the semiconductor substrate;
(3) depositing a polysilicon layer on the gate dielectric layer;
(4) forming a resist mask on the polysilicon layer;
(5) etching the polysilicon layer not masked by the resist mask, thereby forming a gate electrode;
(6) etching a thickness of the gate dielectric layer not covered by the gate electrode;
(7) stripping the resist mask;
(8) forming a salicide block resist mask covering the gate electrode and a portions of the remaining gate dielectric layer laterally protruding an offset "d" from bottom of the gate electrode;
(9) etching away the remaining gate dielectric layer not covered by the salicide block resist mask, thereby exposing the semiconductor substrate and forming a salicide block lug portions with a thickness t2 on two opposite sides of the gate electrode with the offset "d" from sidewalls of the gate electrode, wherein $t_2 < t_1$;
(10) depositing a metal layer over the semiconductor substrate; and
(11) making the metal layer react with the semiconductor substrate, thereby forming a salicide layer that is kept a distance "d" away from the gate electrode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
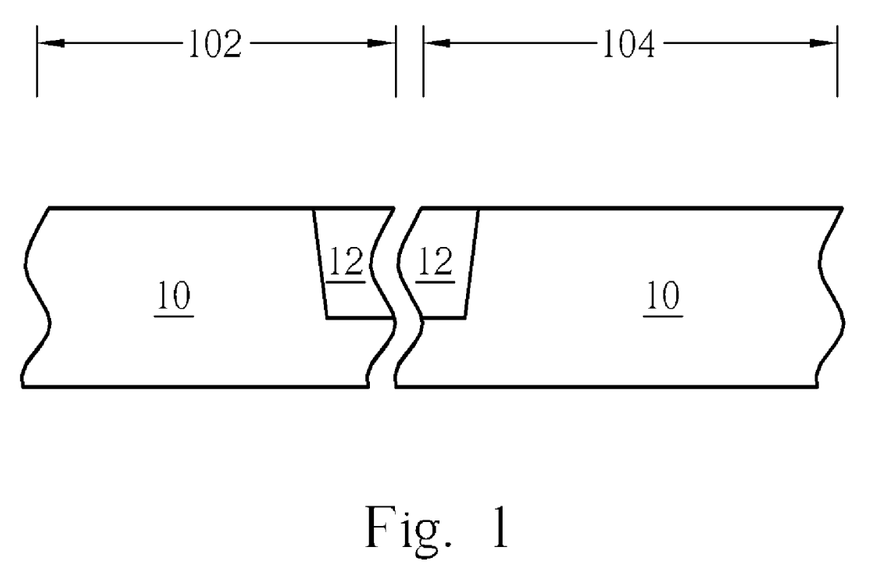
FIG. 1 to FIG. 9 are schematic cross-sectional diagrams showing major intermediate stages in the process of fabricating high- and low-voltage MOS transistor devices in accordance with one preferred embodiment of the present invention.

Please refer to FIG. 1 to FIG. 9. FIG. 1 to FIG. 9 are schematic cross-sectional diagrams showing major intermediate stages in the process of fabricating high- and low-voltage MOS transistor devices in accordance with one preferred embodiment of the present invention. As shown in FIG. 1, a semiconductor substrate 10 is prepared. The semiconductor substrate 10 comprises a low-voltage device area 102 and a high-voltage device area 104. Within the low-voltage device area 102, low-voltage devices such as low-voltage (5V, 3.3V or lower) MOS transistors are fabricated. Within the high-voltage device area 104, high-voltage devices such as high-voltage (18V or even higher) MOS transistors are fabricated. Initially, isolation structures 12 such as shallow trench isolation (STI) and active areas are defined on the semiconductor substrate 10 both in the low-voltage device area 102 and high-voltage device area 104.

Figure 2:
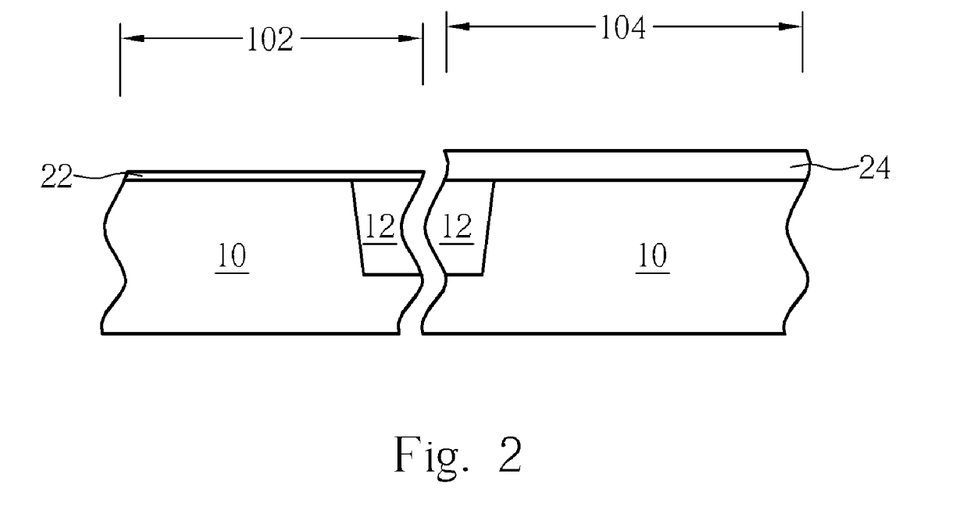

As shown in FIG. 2, a low-voltage gate dielectric 22 and a high-voltage gate dielectric 24 are formed on the surface of the semiconductor substrate 10 within the low-voltage device area 102 and high-voltage device area 104, respectively. Techniques of forming gate dielectrics with two different thicknesses are known in the art, and are not discussed further. According to the preferred embodiment, the low-voltage gate dielectric 22 has a thickness that is less than 200 angstroms, preferably less than or equal to 100 angstroms, while the high-voltage gate dielectric 24 has a thickness that is thicker than 400 angstroms, preferably thicker than 600 angstroms.

Figure 3:
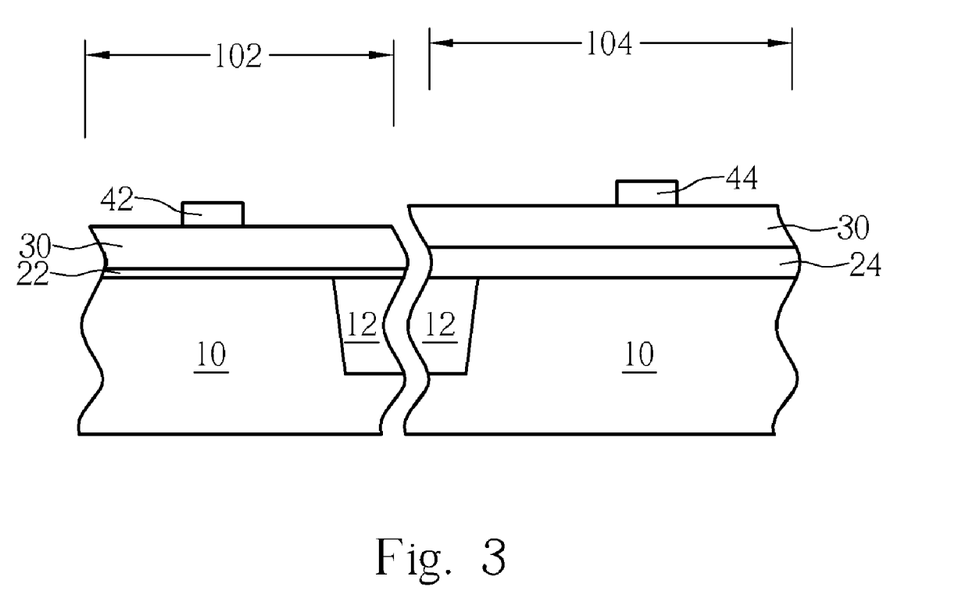

As shown in FIG. 3, a polysilicon layer 30 is deposited on the low-voltage gate dielectric 22 and on the high-voltage gate dielectric 24. A photoresist mask 42 and photoresist mask 44 are defined on the polysilicon layer 30, wherein the photoresist mask 42 defines the gate pattern of a low-voltage MOS transistor device within the low-voltage device area 102, while the photoresist mask 44 defines the gate pattern of a high-voltage MOS transistor device within the high-voltage device area 104.

Figure 4:
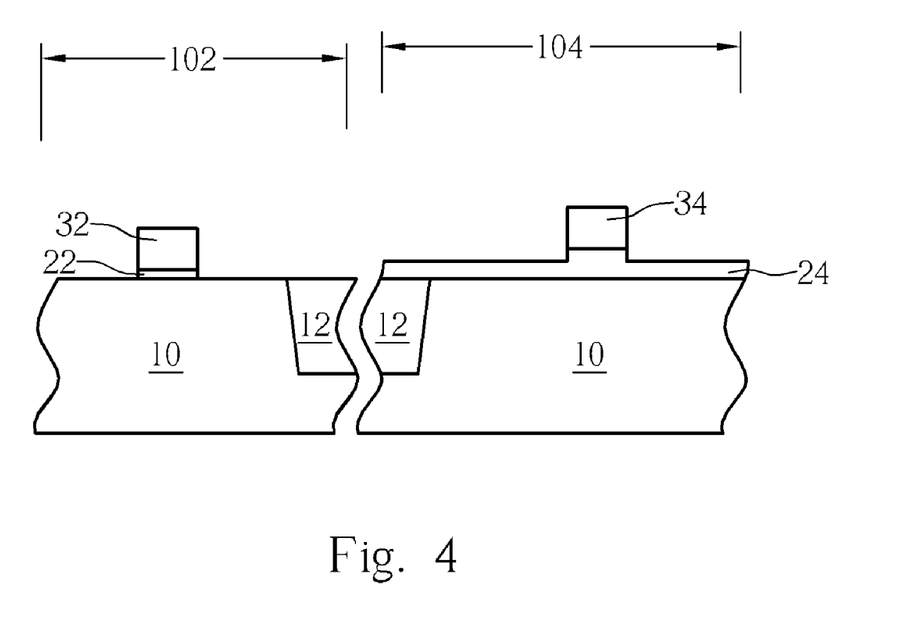

Subsequently, as shown in FIG. 4, using the photoresist masks 42 and 44 as an etching hard mask, a plasma dry etching is carried out to etched away the polysilicon layer 30 that is not covered by the photoresist masks 42 and 44, thereby forming a gate electrode 32 of the low-voltage MOS transistor device and gate electrode 34 of the high-voltage MOS transistor device. The low-voltage dielectric 22 outside the gate electrode 32 is etched away to expose the semiconductor substrate 10. The aforesaid plasma dry etching is not terminated until a predetermined thickness of the thicker high-voltage dielectric 24 is removed. At this phase, the remaining high-voltage dielectric 24 still covers the high-voltage device area 104.

Figure 5:
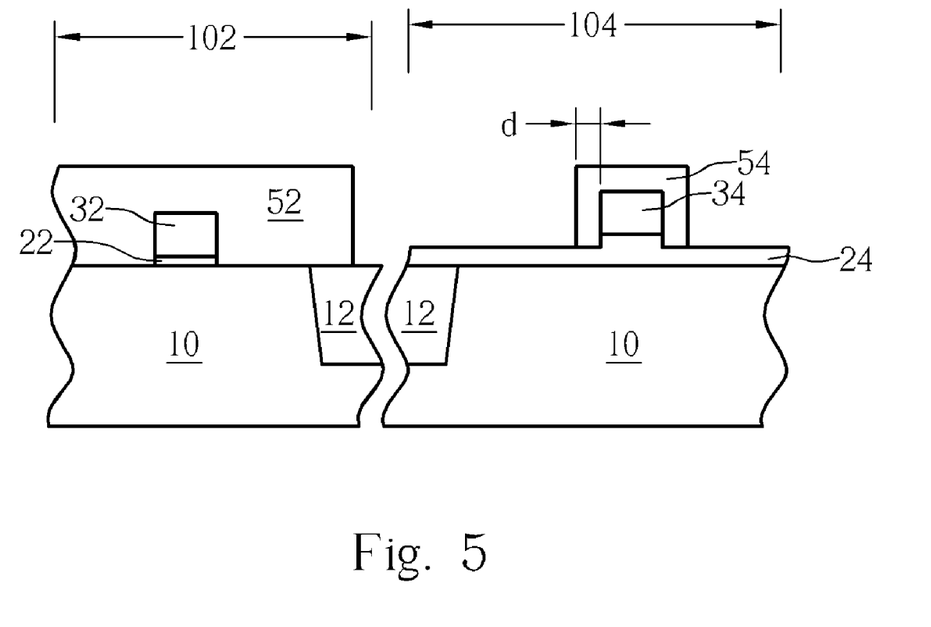

As shown in FIG. 5, a layer of photoresist (not explicitly shown) is coated over the semiconductor substrate 10, and is then exposed and developed using conventional lithography to form photoresist mask 52 and photoresist mask 54. The photoresist mask 52 covers the entire low-voltage device area 102, while the photoresist mask 54 merely masks the gate electrode 34 and a portions of the remaining high-voltage dielectric 24 laterally protruding an offset "d" from the bottom of the gate electrode 34. The offset "d" is substantially equal to the distance between the gate electrode 34 and the source/drain salicide formed in the subsequent processes.

Figure 6:
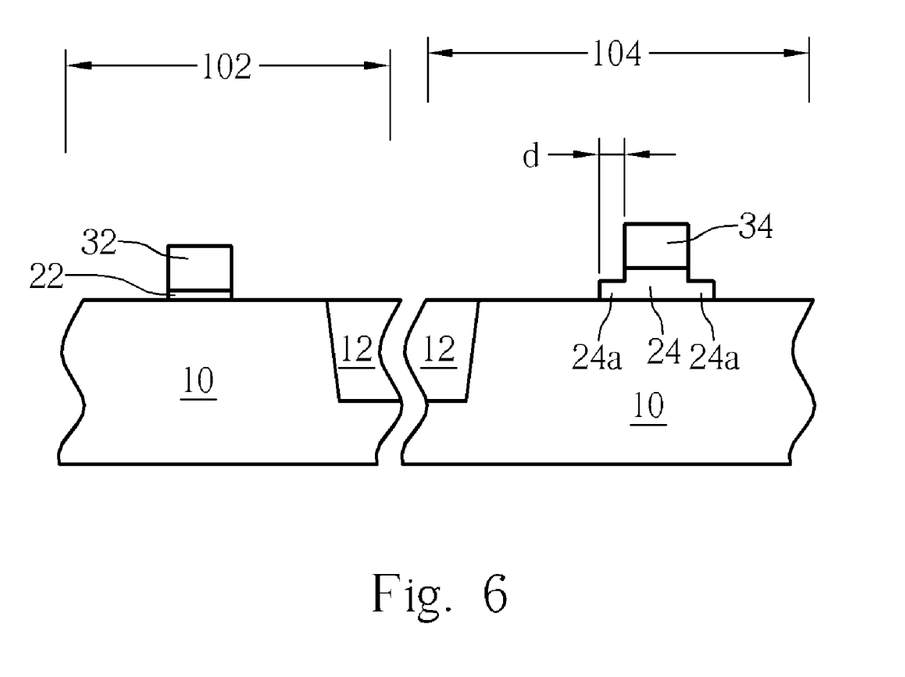

As shown in FIG. 6, using the photoresist mask 52 and photoresist mask 54 as a hard mask, a plasma dry etching is carried out to etch away the remaining high-voltage dielectric 24 that is not covered by the photoresist mask 54. Thereafter, the photoresist mask 52 and photoresist mask 54 are stripped off. The remaining high-voltage dielectric 24 that is not directly under the gate electrode 34 is hereinafter referred to as lug portions 24a that are formed on two opposite sides of the gate electrode 34 with an offset "d" from the gate sidewalls. According to the preferred embodiment, the lug portions 24a have a thickness of about 100~600 angstroms, and the offset "d" is in a range of about 20~500 angstroms.

Figure 7:
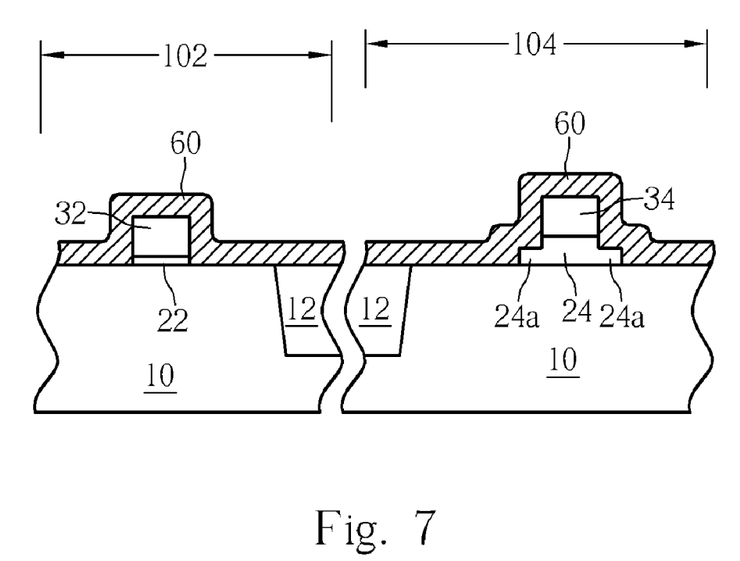
Figure 8:
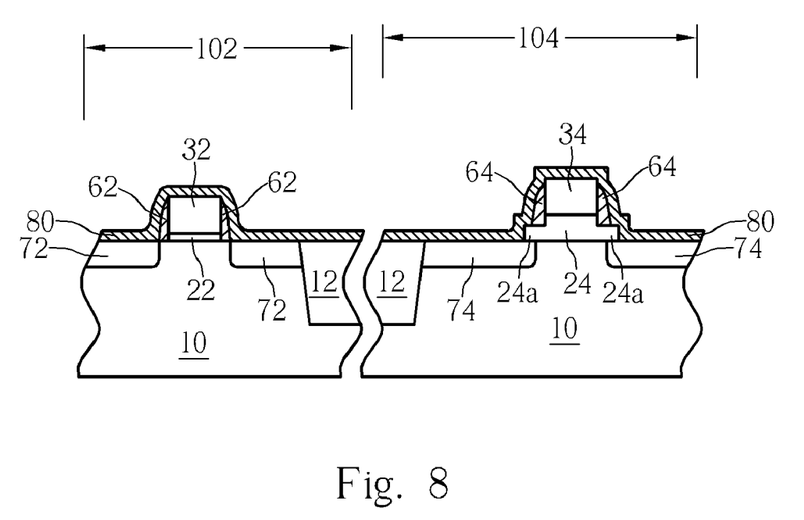

As shown in FIG. 7, a spacer dielectric layer 60 such as silicon nitride is deposited over the semiconductor substrate 10. Next, as shown in FIG. 8, an isotropic dry etching is carried out to etch the spacer dielectric layer 60, thereby forming spacers 62 and 64 on sidewalls of respective gate electrodes 32 and 34. Conventional ion implantation process is then performed to form source/drain regions 72 within the low-voltage device area 102 and source/drain regions 74 within the low-voltage device area 104. After the implantation of source/drain regions, a typical salicide process is carried out. A metal layer 80 such as cobalt or titanium is deposited over the semiconductor substrate 10. The metal layer 80 covers both the low-voltage device area 102 and high-voltage device area 104. It is one feature of the present invention that the lug portions 24a function as a salicide block that keeps the metal layer 80 from contacting the substrate within the offset area directly under the lug portions 24a.

Figure 9:
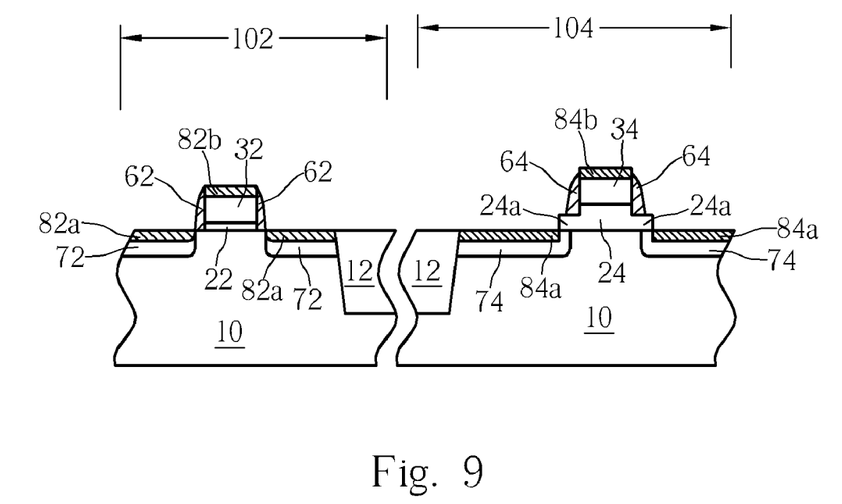

Finally, as shown in FIG. 9, a thermal process is performed. The source/drain regions 72 and 74 that are in contact with the metal layer 80 react with the overlying metal layer 80 to form metal salicide layers 82a and 84a. Simultaneously, metal salicide layers 82b and 84b are formed on the exposed gate electrodes 32 and 34.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating metal-oxide-semiconductor devices, comprising:
   providing a semiconductor substrate;
   forming a gate dielectric layer having a thickness of $t_1$ on the semiconductor substrate;
   depositing a polysilicon layer on the gate dielectric layer;
   forming a resist mask on the polysilicon layer;
   etching the polysilicon layer not masked by the resist mask, thereby forming a gate electrode;
   etching a thickness of the gate dielectric layer not covered by the gate electrode;
   stripping the resist mask;
   forming a salicide block resist mask covering the gate electrode and a portion of the remaining gate dielectric layer laterally protruding an offset "d" from bottom of the gate electrode;
   etching away the remaining gate dielectric layer not covered by the salicide block resist mask, thereby exposing the semiconductor substrate and forming a salicide block lug portions with a thickness $t_2$ on two opposite sides of the gate electrode with the offset "d" from sidewalls of the gate electrode, wherein $t_2<t_1$;
   forming a spacer on the sidewalls of the gate electrode, wherein the spacer has a maximum thickness that is smaller than the offset "d" such that the salicide block lug portions laterally protruding from bottom of the spacer and forms a step thereto;
   depositing a metal layer over the semiconductor substrate; and
   making the metal layer react with the semiconductor substrate, thereby forming a salicide layer that is kept the distance "d" away from the gate electrode.

2. The method for fabricating metal-oxide-semiconductor devices according to claim 1 wherein the thickness $t_1>400$ angstroms.

3. The method for fabricating metal-oxide-semiconductor devices according to claim 1 wherein the thickness $t_2>100$ angstroms.

4. The method for fabricating metal-oxide-semiconductor devices according to claim 1 wherein the offset "d" is in a range of 20~500 angstroms.

5. The method for fabricating metal-oxide-semiconductor devices according to claim 1 wherein the metal layer comprises cobalt and titanium.

6. The method for fabricating metal-oxide-semiconductor devices according to claim 1 wherein the metal-oxide-semiconductor devices are high-voltage (18V or higher voltage) metal-oxide-semiconductor devices.

* * * * *